(12) United States Patent
Joo et al.

(10) Patent No.: US 7,964,903 B2
(45) Date of Patent: *Jun. 21, 2011

(54) THIN FILM TRANSISTOR ARRAY PANEL FOR X-RAY DETECTOR

(75) Inventors: In-Su Joo, Seongnam (KR); Joon-Hoo Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/762,485

(22) Filed: Apr. 19, 2010

(65) Prior Publication Data

US 2010/0200859 A1    Aug. 12, 2010

Related U.S. Application Data

(63) Continuation of application No. 10/538,779, filed as application No. PCT/KR03/02708 on Dec. 11, 2003, now Pat. No. 7,728,329.

(30) Foreign Application Priority Data

Dec. 11, 2002  (KR) .................. 10-2002-0078745

(51) Int. Cl.
  *H01L 31/062* (2006.01)
  *H01L 31/113* (2006.01)
(52) U.S. Cl. .............. 257/292; 257/59; 257/E27.14; 257/E27.146
(58) Field of Classification Search .......... 257/59, 257/E27.14, E27.146, 292
  See application file for complete search history.

(56) References Cited

U.S. PATENT DOCUMENTS

| 5,480,810 | A | | 1/1996 | Wei et al. |
| 5,895,936 | A | | 4/1999 | Lee |
| 6,034,406 | A | * | 3/2000 | Kobayashi et al. ........... 257/435 |
| 6,239,470 | B1 | | 5/2001 | Yamazaki |
| 6,396,046 | B1 | | 5/2002 | Possin et al. |
| 6,453,008 | B1 | | 9/2002 | Sakaguchi et al. |

FOREIGN PATENT DOCUMENTS

| CN | 1185233 | 6/1998 |
| DE | 19944731 | 4/2001 |
| EP | 0403105 | 12/1990 |
| EP | 0788277 | 8/1997 |
| JP | 09199699 | 7/1997 |
| JP | 2001249184 | 9/2001 |
| KR | 102002011035 | 2/2002 |
| KR | 100796754 | 1/2008 |

* cited by examiner

*Primary Examiner* — Howard Weiss
(74) *Attorney, Agent, or Firm* — Cantor Colburn LLP (57) ABSTRACT

A thin film transistor array panel for an X-ray detector includes a dummy pixel including a photo diode and a TFT for detecting leakage current. The photo diode includes first and second electrodes (178,195) facing each other and a photoconductive layer (800) disposed between the first electrode and the second electrode. The TFT includes a semiconductor layer (150), a gate electrode (123), a source electrode (173) connected to a data line, a drain electrode (175) connected to the photo diode. The dummy pixel further includes a light blocking layer (196) for blocking light incident on the photo diode. Alternatively, the semiconductor layer is disconnected between the source electrode and the drain electrode.

13 Claims, 8 Drawing Sheets

THIN FILM TRANSISTOR ARRAY PANEL FOR X-RAY DETECTOR

CROSS REFERENCE TO RELATED APPLICATIONS

This application is a continuation of U.S. application Ser. No. 10/538,779, filed on Dec. 30, 2005 (now U.S. Pat. No. 7,728,329), which claims priority to Korean Patent Application No. 10-2002-0078745, filed on Dec. 11, 2002, via intervening International Application No. PCT/KR03/02708, filed on Dec. 11, 2003, and all the benefits accruing therefrom under 35 U.S.C. §119, and the contents of which in its entirety are herein incorporated by reference.

BACKGROUND OF THE INVENTION (a) Field of the Invention

The present invention relates to a thin film transistor array panel, and in particular, to a thin film transistor array panel for an X-ray detector.

(b) Description of the Related Art

An X-ray detector includes a thin film transistor (TFT) array panel provided with an array of TFTs. Each pixel of the TFT array panel includes a P type photo-conductive layer containing P type impurity, an intrinsic photo-conductive layer without impurity, an N type photo-conductive layer N type impurity, and an array of PIN photo diodes including two electrodes for applying voltages across the conductive layers. The X-ray detector is a device for converting a light into an electrical signal, which applies a bias voltage to electrons generated by the PIN photo diodes in response to X-ray from an external device to transmit the electrons to other devices.

However, the electrical signal generated by the TFT array panel for an X-ray detector may include leakage current flowing in the photo diodes or on a surface of the photo diodes. Accordingly, it is difficult to determine a reference for the electrical signal including the leakage current.

SUMMARY OF THE INVENTION

A motivation of the present invention is to solve the above-described problems.

According to an aspect of an embodiment of the present invention, a TFT array panel for an X-ray detector includes a dummy pixel for detecting leakage current.

A thin film transistor array panel for an X-ray detector is provided, which includes: a gate wire formed on an insulating substrate and including a gate lines and a gate electrode connected to the gate line; a gate insulating layer formed on the gate wire; a semiconductor layer formed on the gate insulating layer; a data wire formed on the gate insulating layer and including a data line intersecting the gate line, a source electrode connected to the data line and disposed on the semiconductor layer at least in part, and a drain electrode disposed on the semiconductor layer at least in part and separated from the source electrode; a photo diode including a first electrode connected to the drain electrode, a second electrode facing the first electrode, and a photo-conductive layer disposed between the first electrode and the second electrode; and a bias signal line connected to the second electrode and including a light blocking layer covering the photo diode.

A thin film transistor array panel for an X-ray detector is provided, which includes: a gate wire formed on an insulating substrate and including a gate lines and a gate electrode connected to the gate line; a gate insulating layer formed on the gate wire; a semiconductor layer formed on the gate insulating layer; a data wire formed on the gate insulating layer and including a data line intersecting the gate line, a source electrode connected to the data line and disposed on the semiconductor layer at least in part, and a drain electrode disposed on the semiconductor layer at least in part and separated from the source electrode; a photo diode including a first electrode connected to the drain electrode, a second electrode facing the first electrode, and a photo-conductive layer disposed between the first electrode and the second electrode; and a bias signal line connected to the second electrode, wherein the semiconductor layer is disconnected between the source electrode and the drain electrode.

The photo-conductive layer may include a first amorphous silicon film containing N type impurity, a second amorphous silicon film without impurity, and a third amorphous silicon film containing P type impurity.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Then, TFT array panels for an X-ray detector according to embodiments of the present invention are described in detail with reference to accompanying drawings.

A TFT array panel for an X-ray detector according to an embodiment of the present invention includes a plurality of normal pixels for converting X-ray into electrical signals to obtain images and at least one dummy pixel for detecting leakage current. The dummy pixel detects the leakage current in absence of incident light and they do not contribute to the generation of the images.

Figure 1:
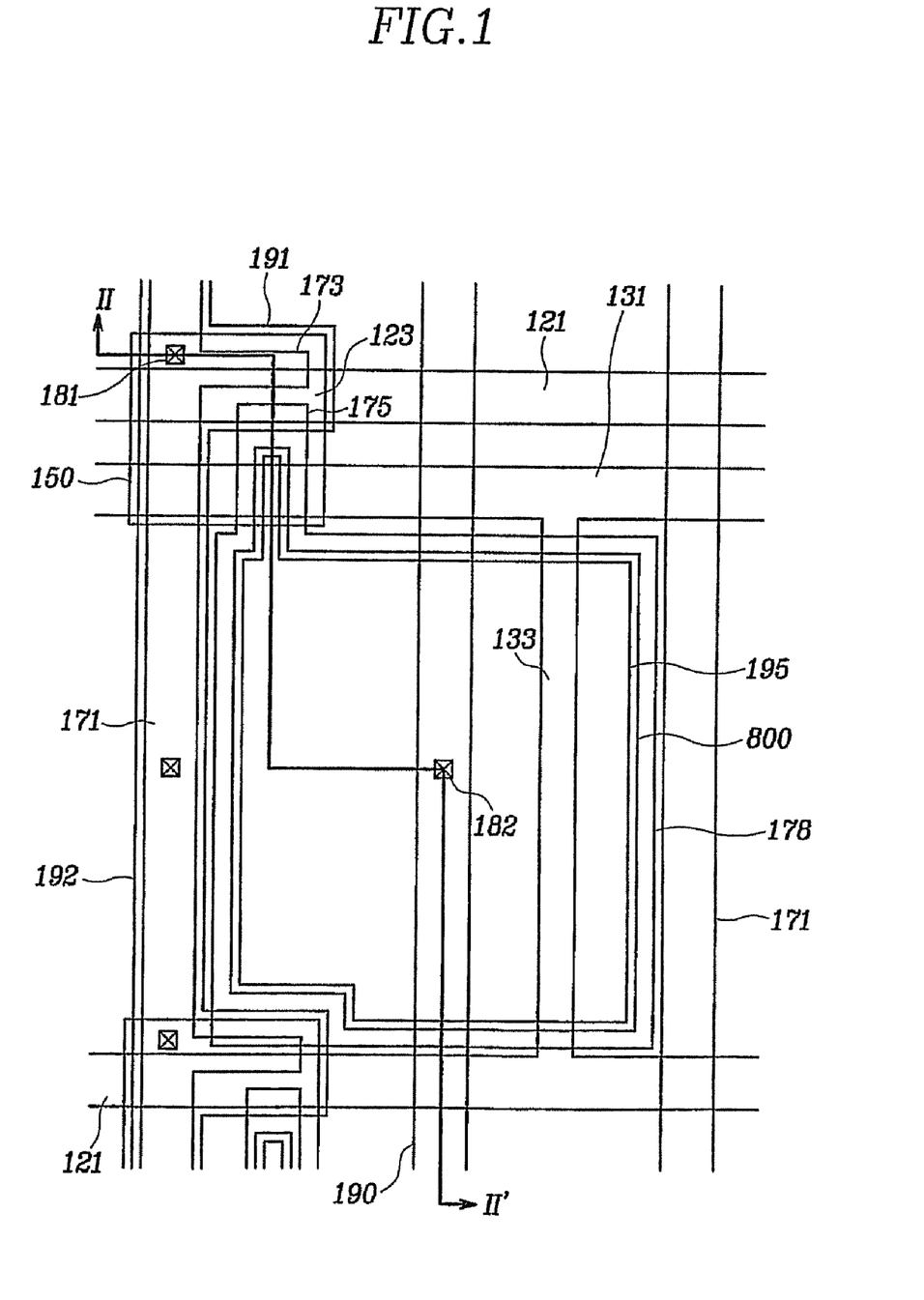
FIG. 1 is a layout view of a normal pixel of a TFT array panel for an X-ray detector according to an embodiment of the present invention.
Figure 2:
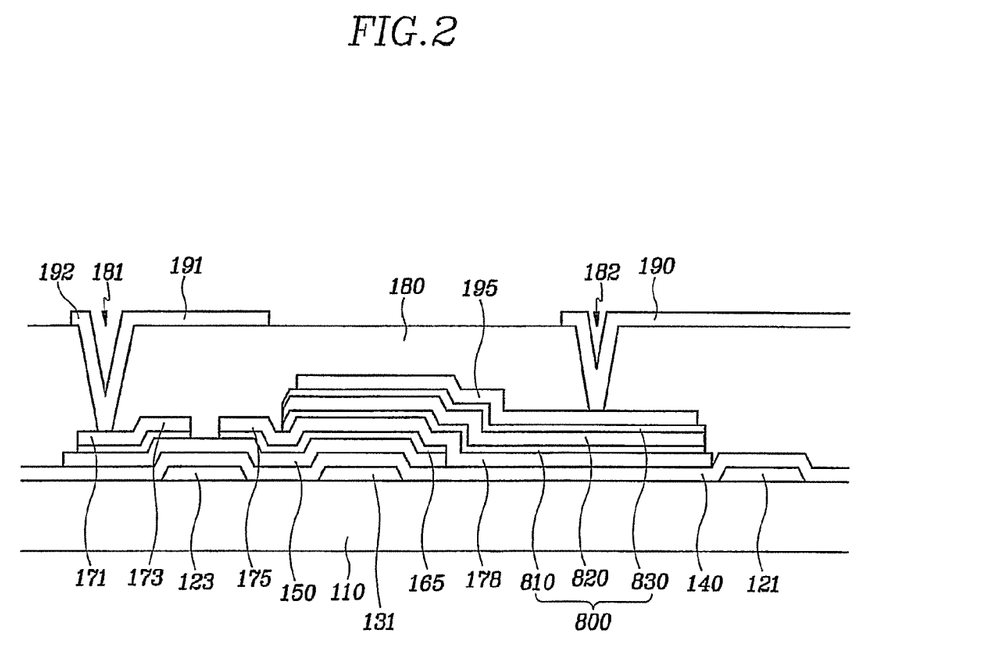
FIG. 2 is a sectional view of the normal pixel of the TFT array panel shown in FIG. 1 taken along the line II-II'.

FIG. 1 is a layout view of a normal pixel of a TFT array panel for an X-ray detector according to an embodiment of the present invention, and FIG. 2 is a sectional view of the normal pixel of the TFT array panel shown in FIG. 1 taken along the line II-II'.

Referring to FIGS. 1 and 2, a gate wire preferably made of a metal having low resistivity such as Al containing metal is formed on an insulating substrate 110. The gate wire includes a plurality of pairs of gate lines 121 and 131 extending in a transverse direction, and a plurality of gate electrodes connected to the gate lines 121. The gate lines 121 may have expanded end portions for receiving gate signals from an external device. The gate wire further includes a plurality of gate connections 133 connecting the pairs of gate lines 121 and 131 for preventing the disconnections of the gate signals. One of each pair of gate lines 121 and 131 may be omitted.

A gate insulating layer 140 preferably made of silicon nitride (SiNx) is formed on the gate wire 121, 131, 123 and 133.

A plurality of semiconductor islands 150 preferably made of hydrogenated amorphous silicon are formed on the gate insulating layer 140 and it is located opposite the gate electrodes 131. The ohmic contacts 163 and 165 preferably made of silicide or n+ hydrogenated amorphous silicon heavily doped with n type impurity are formed on the semiconductor islands 150.

A data wire preferably made of a metal such as Mo, MoW alloy, Cr, Ta, and Ti is formed on the ohmic contacts 163 and 165 and the gate insulating layer 140. The data wire includes a plurality of data lines 171 extending in a longitudinal direction to intersect the gate lines 121 and 131 such that they define a plurality of pixel areas along with the gate lines 121 and 131 the data lines 171. As shown in FIG. 1, the semiconductor islands 150 extend to the intersections of the data lines 171 and the gate lines 121 and 131 for enhancing the insulating therebetween. The data wire further includes a plurality of source electrodes 173 connected to the data lines 171 and extending onto the ohmic contacts 163 and a plurality of drain electrodes 175 separated from the source electrodes 173 and disposed on the ohmic contacts 165 opposite the source electrodes 173 with respect to the gate electrodes 123. The data lines 171 may have expanded end portions for receiving data voltages from an external device. The data wire further includes a plurality of lower electrodes 178 of PIN photo diodes connected to the drain electrodes 175.

The data wire 171, 173, 175 and 178 may have a dual-layered structure including a low resistivity conductive layer preferably made of Al containing metal and a contact assist conductive layer having a good contact characteristic with other materials. Cr/Al (or Al alloy) and Al/Mo are such examples.

A plurality of photo-conductive members 800 are formed on the lower electrodes 178. Each photo-conductive member 800 includes an N type amorphous silicon layer 810 containing N type impurity, an intrinsic amorphous silicon layer 820 without impurity doping, a P type amorphous silicon layer 830 containing P type impurity. The photo-conductive members 800 generate electrons or holes in response to X-ray illuminated by an external device.

A plurality of upper electrodes 195 of the PIN photo diodes are formed on the photo-conductive members 800. The upper electrodes 195 are preferably made of transparent material such as ITO (indium tin oxide) or IZO (indium zinc oxide).

A lower electrode 178, a photo-conductive member 800, and an upper electrode 195 form a PIN photo diode.

A passivation layer 180 is formed on the data wire 171, 173, 175 and 178, and portions of the semiconductor islands 150 and the upper electrodes 195, which are not, covered by the data wire 171, 173, 175 and 178. The passivation layer 180 preferably includes a chemical vapor deposition (CVD) insulating film having a dielectric constant equal to or lower than about 4.0 or an organic insulating film. The CVD insulating film is preferably made of SiO:C or SiO:F having relatively low resistivity and it preferably has a thickness equal to or larger than about one micron such that it improves profiles of other layers disposed thereon. Furthermore, the CVD film has a good adhesiveness so that it prevents the loss of other layers deposited thereon. Accordingly, the SiO:C CVD film or the SiO:F CVD film has an advantage compared with silicon nitride or silicon oxide, which hardly has a large thickness over 5,000 Å due to stress on the panel to have poor step coverage and has high dielectric constant to cause current leakage, and it also has an advantage compared with organic material having poor adhesiveness.

The passivation layer 180 has a plurality of contact holes 181 and 182 exposing the data lines 171 and the upper electrodes 195, respectively.

A plurality of bias signal lines 190 and a plurality of auxiliary data lines 192 are formed on the passivation layer 180.

The bias signal lines 190 extend along the longitudinal direction and are connected to the upper electrodes 195 through the contact holes 182. The bias signal lines 190 transmit a bias voltage to the upper electrodes 195 for controlling electrons and holes generated by the photo-conductive members 800.

The auxiliary data lines 192 are connected to the data lines 171 through the contact holes 181 and overlap the data lines 171. The auxiliary data lines 192 provide compensatory signal paths for the data voltages and include a plurality of projections for blocking light incident on the semiconductor islands 150 of the TFTs.

Figure 3:
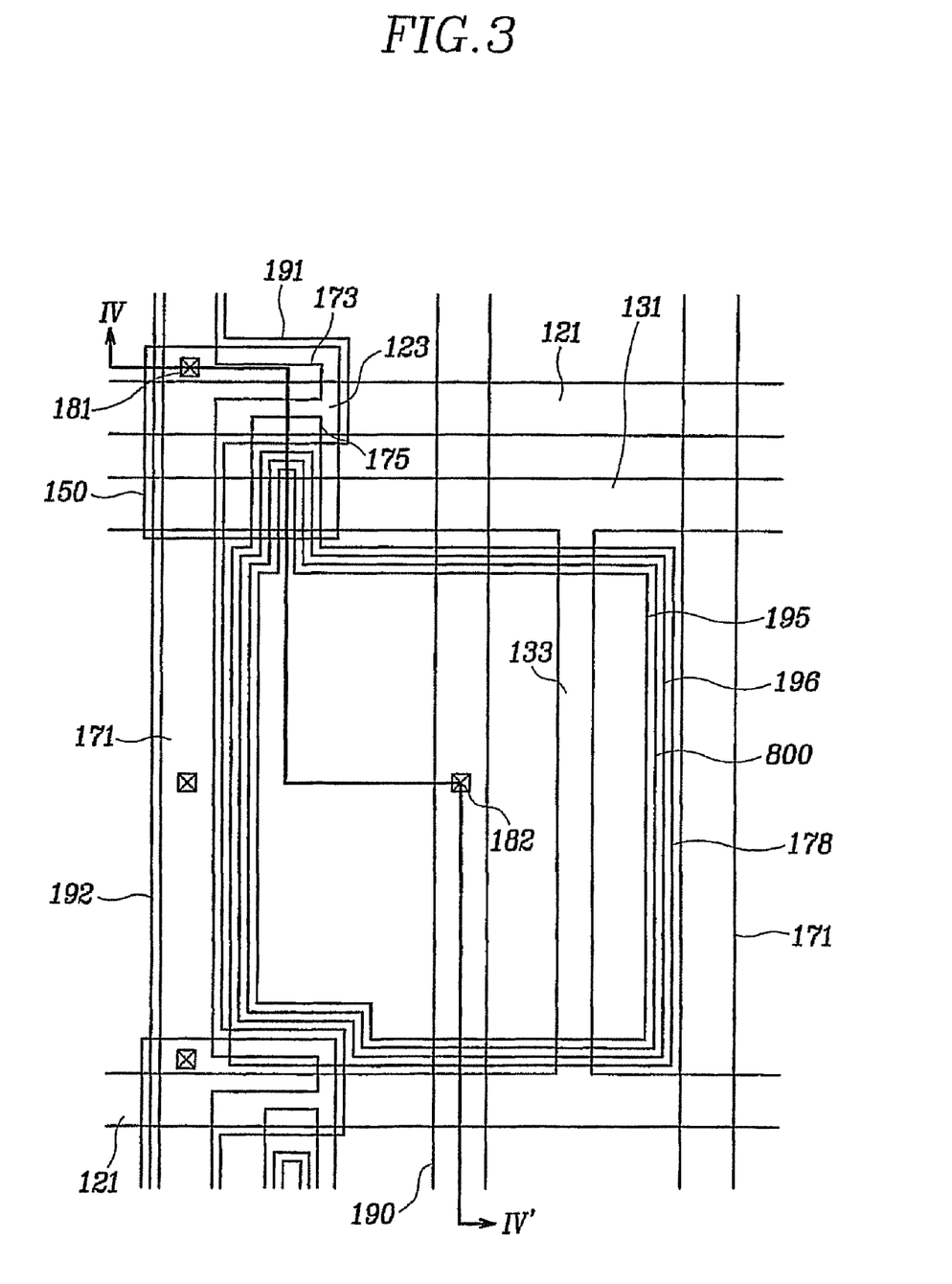
FIG. 3 is a layout view of a dummy pixel a TFT array panel for an X-ray detector according to an embodiment of the present invention.
Figure 4:
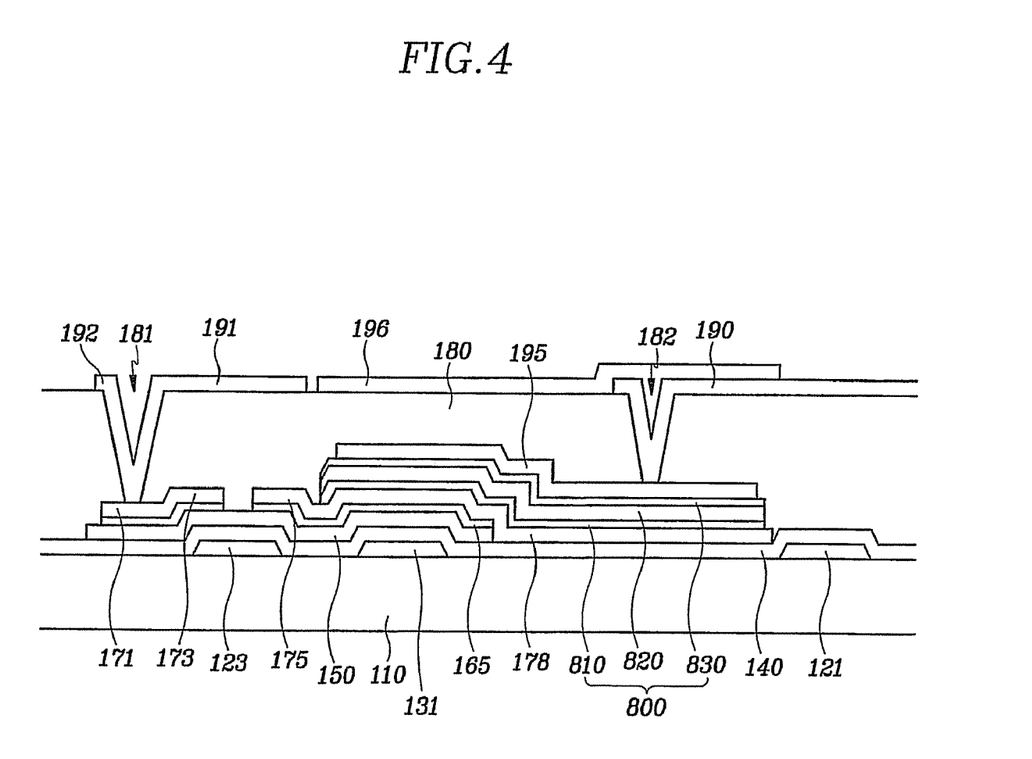
FIG. 4 is a sectional view of the dummy pixel of the TFT array panel shown in FIG. 3 taken along the line IV-IV'.
Figure 5:
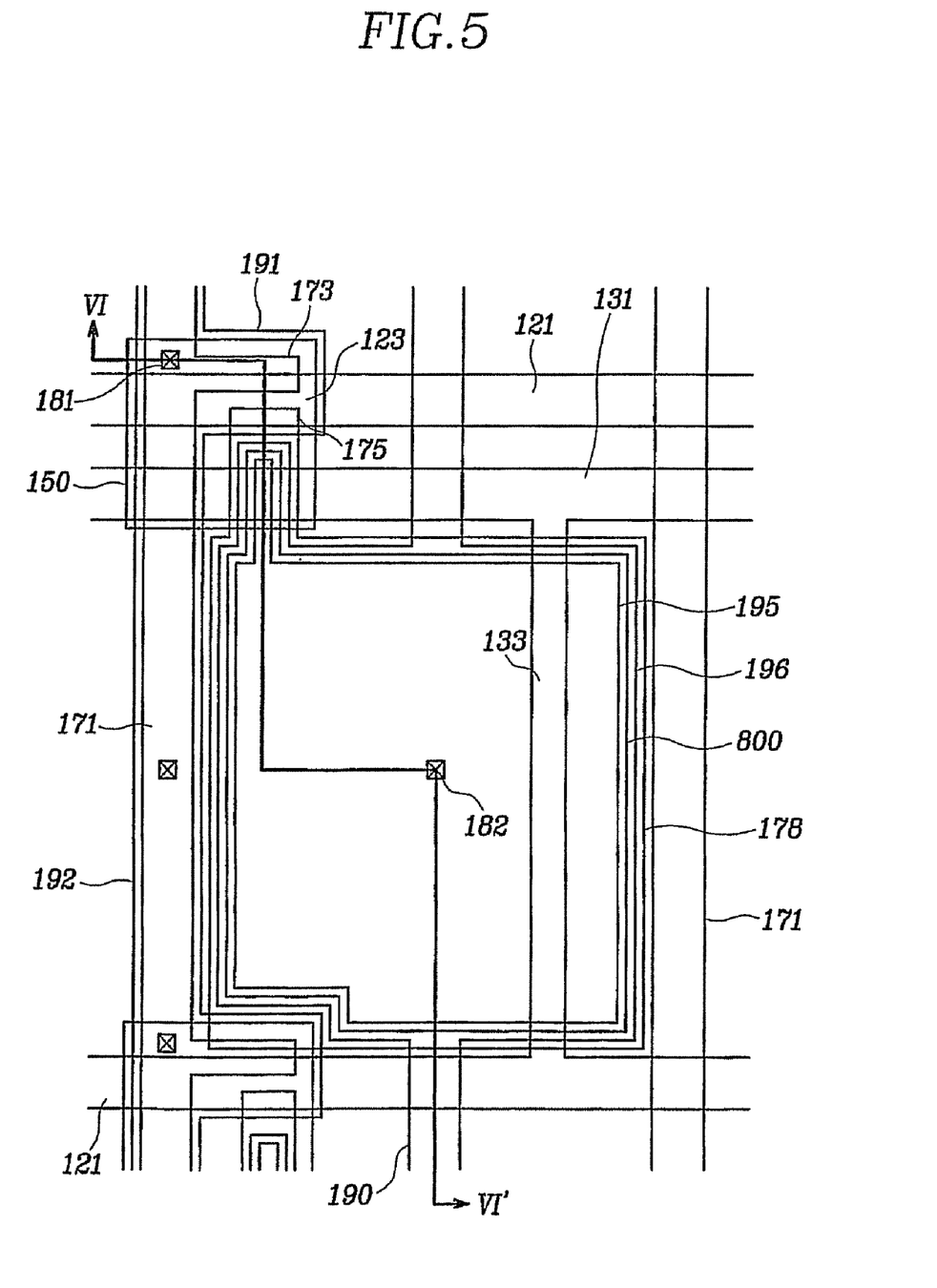
FIG. 5 is a layout view of a dummy pixel a TFT array panel for an X-ray detector according to another embodiment of the present invention.
Figure 6:
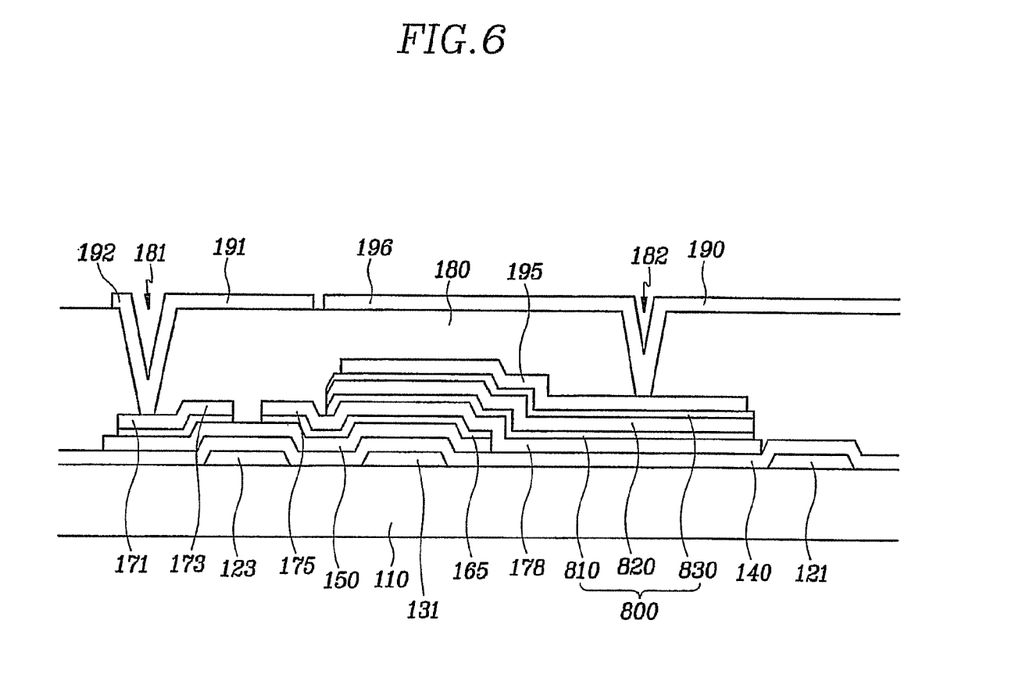
FIG. 6 is a sectional view of the dummy pixel of the TFT array panel shown in FIG. 5 taken along the line VI-VI'.

FIG. 3 is a layout view of a dummy pixel a TFT array panel for an X-ray detector according to an embodiment of the present invention, and FIG. 4 is a sectional view of the dummy pixel of the TFT array panel shown in FIG. 3 taken along the line IV-IV'. FIG. 5 is a layout view of a dummy pixel a TFT array panel for an X-ray detector according to another embodiment of the present invention, and FIG. 6 is a sectional view of the dummy pixel of the TFT array panel shown in FIG. 5 taken along the line VI-VI'.

A dummy pixel of a TFT array panel for an X-ray detector shown in FIGS. 3-6 according to an embodiment of the present invention has a structure similar to that shown in FIGS. 1 and 2.

The dummy pixel includes a light blocking member 196 disposed on a PIN photo diodes including a lower electrode 178, a photo-conductive member 800, and an upper electrodes 195 for blocking X-ray incident on the PIN photo diode.

Referring to FIGS. 3 and 4, the light blocking member 196 is formed on a passivation layer 180. An additional insulating layer (not shown) may be interposed between the light blocking member 196 and a bias signal line 190.

Referring to FIGS. 5 and 6, the light blocking member 196 is formed of the same layer as a bias signal line 190.

Figure 7:
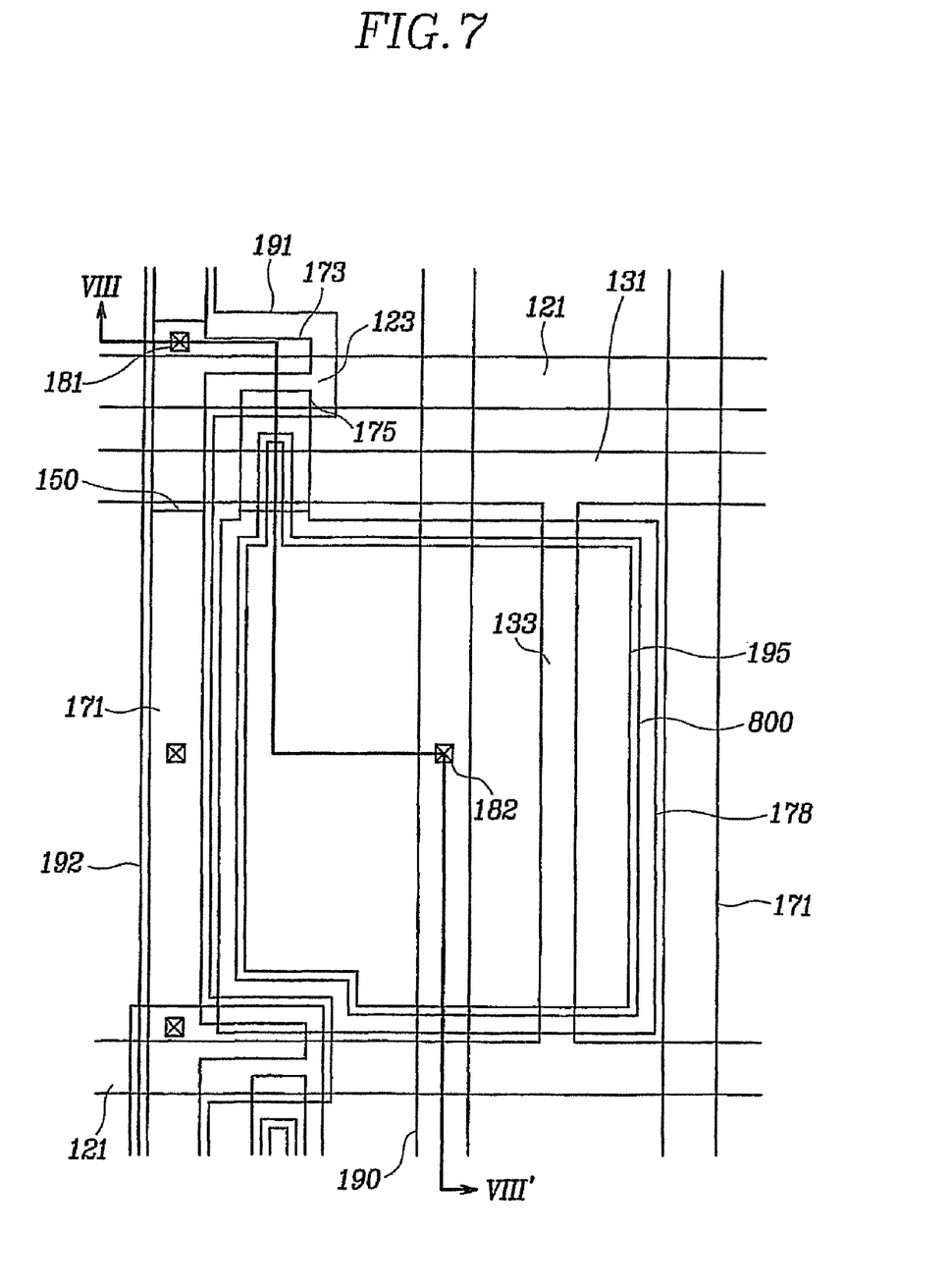
FIG. 7 is a layout view of a dummy pixel a TFT array panel for an X-ray detector according to another embodiment of the present invention.
Figure 8:
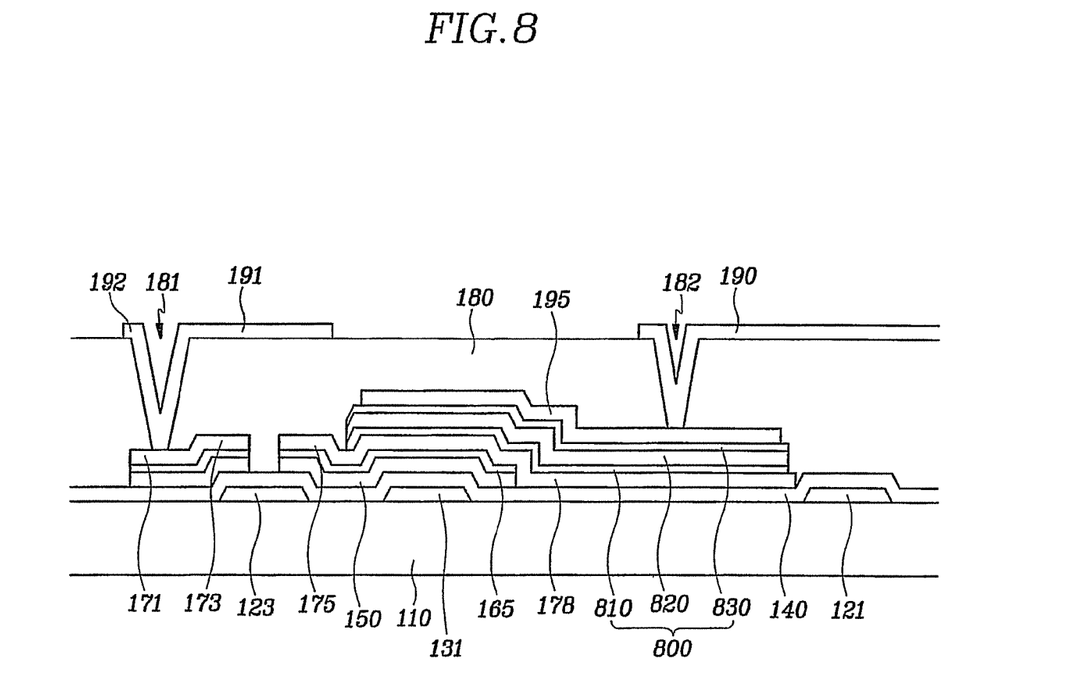
FIG. 8 is a sectional view of the dummy pixel of the TFT array panel shown in FIG. 7 taken along the line VIII-VIII'.

FIG. 7 is a layout view of a dummy pixel a TFT array panel for an X-ray detector according to another embodiment of the present invention, and FIG. 8 is a sectional view of the dummy pixel of the TFT array panel shown in FIG. 7 taken along the line VIII-VIII'.

Referring to FIGS. 7 and 8, a semiconductor island 150 of a dummy pixel is disconnected between a source electrode 173 and a drain electrode such that electrical signals generated by photo current is not transmitted to a data line 171.

As described above, the TFT array panels according to the embodiments of the present invention includes a dummy pixel including a light blocking member for blocking light incident on photo diodes or includes disconnected semiconductor channels of TFTs. Accordingly, the electrical signal generated by leakage current is precisely detected to determine a reference signal.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel for an X-ray detector, the thin film transistor array panel comprising:
    a gate wire formed on an insulating substrate and comprising a gate line and a gate electrode connected to the gate line;
    a gate insulating layer formed on the gate wire;
    a semiconductor layer formed on the gate insulating layer;
    a data wire formed on the gate insulating layer and comprising:
        a data line which intersects the gate line;
        a source electrode connected to the data line and disposed on the semiconductor layer; and
        a drain electrode disposed on the semiconductor layer separate from the source electrode;
    a photo diode comprising:
        a first electrode connected to the drain electrode;
        a second electrode which faces the first electrode; and
        a photo-conductive layer disposed between the first electrode and the second electrode;
    a passivation layer disposed on the photodiode, the semiconductor layer, the data wire and the drain electrode, the passivation layer having a first contact hole which exposes the second electrode;
    a bias signal line disposed on the passivation layer and connected to the second electrode through the first contact hole; and
    a light blocking layer disposed directly on the passivation layer and the bias signal line to cover the photo diode.

2. The thin film transistor array panel of claim 1, wherein the photo-conductive layer comprises a first amorphous silicon film comprising an N type impurity, a second amorphous silicon film disposed on the first amorphous silicon film and comprising intrinsic amorphous silicon, and a third amorphous silicon film disposed on the second amorphous silicon film and comprising a P type impurity.

3. The thin film transistor array panel of claim 2, wherein the second electrode comprises transparent conductive oxide.

4. The thin film transistor array panel of claim 1, further comprising an insulating layer interposed between the light blocking member and the bias signal line.

5. The thin film transistor array panel of claim 1, wherein at least a portion of the bias signal line is disposed between the passivation layer and the light blocking layer.

6. The thin film transistor array panel of claim 5, further comprising an insulating layer interposed between the light blocking member and the bias signal line.

7. The thin film transistor array panel of claim 6, wherein the second electrode comprises transparent conductive oxide.

8. The thin film transistor array panel of claim 1, wherein the bias signal line and the data line are extended along the same direction.

9. The thin film transistor array panel of claim 8, further comprising an auxiliary data line connected to the data line through a second contact hole of the passivation layer which exposes the data line.

10. The thin film transistor array panel of claim 9, wherein the photo-conductive layer comprises a first amorphous silicon film comprising an N type impurity, a second amorphous silicon film disposed on the first amorphous silicon film and comprising intrinsic amorphous silicon, and a third amorphous silicon film disposed on the second amorphous silicon film and comprising a P type impurity.

11. The thin film transistor array panel of claim 10, wherein the second electrode comprises transparent conductive oxide.

12. The thin film transistor array panel of claim 11, further comprising an insulating layer interposed between the light blocking member and the bias signal line.

13. The thin film transistor array panel of claim 9, wherein at least a portion of the bias signal line is disposed between the passivation layer and the light blocking layer.

* * * * *